United States Patent [19]

Matsumura et al.

[11] Patent Number: 4,935,896

[45] Date of Patent: Jun. 19, 1990

[54] SEMICONDUCTOR MEMORY DEVICE HAVING THREE-TRANSISTOR TYPE MEMORY CELLS STRUCTURE WITHOUT ADDITIONAL GATES

[75] Inventors: Tetsuya Matsumura; Masahiko Yoshimoto, both of Hyogo, Japan

[73] Assignee: Mitsubishi Denki Kabushiki Kaisha, Tokyo, Japan

[21] Appl. No.: 266,057

[22] Filed: Nov. 2, 1988

[30] Foreign Application Priority Data

Nov. 24, 1987 [JP] Japan .................................. 62-295517

[51] Int. Cl.⁵ ...................... G11C 11/40; G11C 11/24; G11C 7/00
[52] U.S. Cl. .................................... 365/187; 365/149; 365/222
[58] Field of Search ............... 365/149, 187, 186, 222, 365/230.03

[56] References Cited

U.S. PATENT DOCUMENTS

| 3,618,053 | 11/1971 | Hudson et al. | 365/187 |
| 3,699,544 | 10/1972 | Joynson et al. | 365/149 |
| 3,706,079 | 12/1971 | Vadasz et al. | 365/187 |
| 4,025,007 | 5/1977 | Karn et al. | 365/154 |
| 4,044,340 | 8/1977 | Itoh | 365/222 |
| 4,247,919 | 1/1981 | White, Jr. et al. | 365/222 X |
| 4,308,594 | 12/1981 | Jiang | 365/149 |

FOREIGN PATENT DOCUMENTS

60-20388  2/1985  Japan .................................. 365/187

OTHER PUBLICATIONS

IEEE Journal of Solid-State Circuits, vol. SC-8, No. 5, Oct. 73, "A 4K MOS Dynamic RAM", by Abbott et al.
H. Masuda, "A 5V-Only 64K Dynamic RAM Based on High S/N Design", IEEE Journal of Solid-State Circuits, vol. SC-15, No. 5.
Excerpt from Chapter 8 "Memory Systems", Section 8.4.1, "Three-Transistor Dynamic Memory Cell", pp. 268-273.
P. Wu, "Read/Write Dynamic Memory Using Two Devices Per Call and Having Internal Refresh", IBM Technical Disclosure Bulletin, vol. 23, No. 10, (Mar. 1981), pp. 4620-4621.
R. C. Wong "Hybrid Memory Cells For Two-Port 'RAMS", IBM Technical Disclosure Bulletin, vol. 26, No. 10B (Mar. 1984) pp. 5401-5405.
Funkschau-Arbeitsblatter "Grundschaltungen der Elektronik" (1984), pp. 59-66.
T. Pai, "FIFO RAM controller tackles deep data buffering" Computer Design (Aug. 1, 1986), pp. 109-112.

Primary Examiner—James W. Moffitt
Assistant Examiner—Alfonso Garcia
Attorney, Agent, or Firm—Lowe, Price, Leblanc, Becker & Shur

[57] ABSTRACT

A memory cell array (61) comprises a plurality of three-transistor type memory cells (10) arranged in a plurality of rows and columns. A plurality of pairs of write bit lines (WB1, WB2) and a plurality of read bit lines (RB) are provided corresponding to each column of the memory cell array (61). The plurality of write word lines (WWL) and the plurality of read word lines (RWL) are provided corresponding to each row of the memory cell array (61). Information is written to memory cells (10) in odd rows through the respective one write bit lines of the pairs of write bit lines (WB1, WB2), and information is written to memory cells (10) in even rows through the respective other write bit lines of the pairs of write bit lines (WB1, WB2). A sense amplifier (30) is connected to each of the pairs of write bit lines (WB1, WB2). At the time of write operation, refresh operation is performed by the sense amplifier (30) with respect to memory cells (10) in non-selected columns.

13 Claims, 9 Drawing Sheets

F I G . 1 A
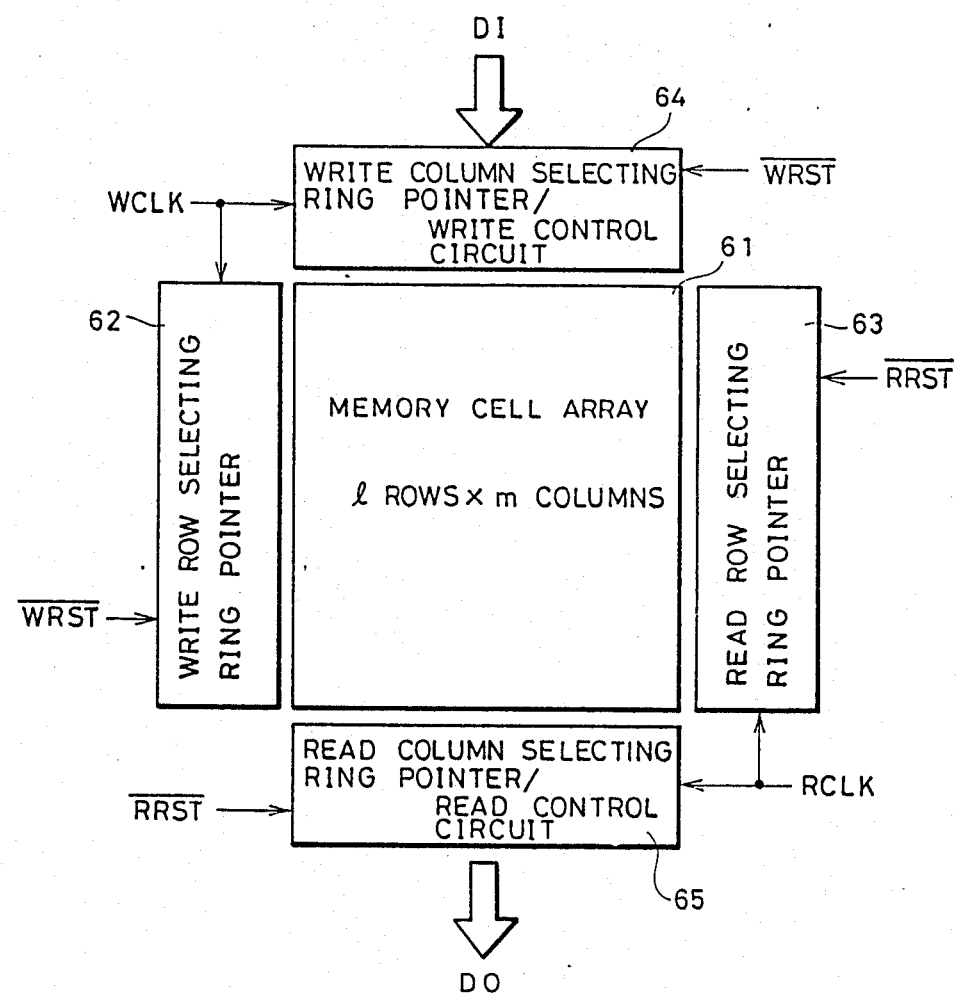

SEMICONDUCTOR MEMORY DEVICE HAVING THREE-TRANSISTOR TYPE MEMORY CELLS STRUCTURE WITHOUT ADDITIONAL GATES

BACKGROUND OF THE INVENTION

1. Field of the Invention

The present invention relates generally to a dynamic type semiconductor memory device, more particularly to such device comprising three-transistor type memory cells.

2. Description of the Prior Art

FIG. 1A is a schematic block diagram of a serial access memory.

Referring to FIG. 1A, a memory cell array 61 comprises a plurality of three-transistor type memory cells arranged in l rows and m columns. A memory cell to which data is to be written is selected by a write row selecting ring pointer 62 and a write column selecting ring pointer 64. In addition, a memory cell from which data is to be read out is selected by a read row selecting ring pointer 63 and a read column selecting ring pointer 65. The write column selecting ring pointer 64 comprises a write control circuit, and the read column selecting ring pointer 65 comprises a read control circuit.

A serial access memory generally is one in which the order of accessing memory cells in a memory cell array is determined. In this serial access memory, access is made in the order as shown in FIG. 1B. More specifically, access to memory cells is made in the order from a memory cell in the first row in the first column to a memory cell in the l-th row in the first column. Then, access to memory cells is made in the order from a memory cell in the first row in the second column to a memory cell in the l-th row in the second column. In the above described manner, when access to a memory cell in the l-th row in the m-th column is completed, access is made in the order, beginning with a memory cell in the first row in the first column in the same manner.

In FIG. 1A, first, the write row selecting ring pointer 62, the write column selecting ring pointer 64, the read row selecting ring pointer 63 and the read column selecting ring pointer 65 are initialized in response to a write reset $\overline{WRST}$ and a read reset signal $\overline{RRST}$ which are externally applied, respectively. As a result, the first row in the first column of the memory cell array 61 is designated. Thereafter, the second row, the third row, . . . , the l-th row in the first column are sequentially designated and then, the first row, the second row, . . . , the l-th row in the second column are sequentially designated in synchronization with a write clock WCLK and a read clock RCLK which are externally applied, respectively. After the l-th row in the m-th column is designated, the first row in the first column is designated. Thereafter, the same addressing is repeated until the write reset signal $\overline{WRST}$ and the read reset signal $\overline{RRST}$ are inputted. Input data DI is written by the write control circuit to a memory cell designated by the write row selecting ring pointer 62 and the write column selecting ring pointer 64. Information stored in a memory cell designated by the read row selecting ring pointer 63 and the read column selecting ring pointer 65 is read out as output data DO from the read control circuit. Write operation and read operation are performed independently each other.

FIG. 2 is a circuit diagram showing structure of main portions of the serial access memory shown in FIG. 1A.

A write bit line $WB_k$ and a read bit line $RB_k$ are provided corresponding to each column of the memory cell array 61, where k is any of integers from 1 through m. A write driver 11 is connected to each write bit line $WB_k$ and a read circuit 13 is connected to each read bit line $RB_k$. In addition, a write word line $WWL_n$ and a read word line $RWL_n$ are provided corresponding to each row of the memory cell array 61, where n is any of integers from 1 through l. A write selecting gate 12 comprising an AND gate is provided corresponding to each of memory cells 10. FIG. 2 illustrates memory cells 10 in the n-th row, the (n+1)-th row and the (n+2)-th row in the k-th column and the (k+1)-th column of the memory cell array 61. Each of the memory cells 10 is a three-transistor type memory cell comprising transistors 1, 2 and 3. Each of the transistors 1, 2 and 3 comprises an N channel MOS field effect transistor. Numeral 4 denotes a storage capacitance.

Let's consider the memory cell 10 in the n-th row in the k-th column. The transistor 3 has its gate connected to the write bit line $WB_k$ through the transistor 1, its drain connected to the read bit line $RB_k$ through the transistor 2 and its source connected to ground. The transistor 1 has its gate connected to an output of the write selecting gate 12. The transistor 2 has its gate connected to the read word line $RWL_n$. The write selecting gate 12 has one input terminal connected to the write word line $WWL_n$. The write word line $WWL_n$ is connected to the write row selecting ring pointer 62 shown in FIG. 1. The read word line $RWL_n$ is connected to the read row selecting ring pointer 63.

The write selecting gates 12 in each column have respective other input terminals all receiving a write column selecting signal $WBS_k$ by the write column ring pointer 64. In addition, the read circuit 13 in each column receives a read column selecting signal $RBS_k$ by the read column selecting ring pointer 65.

Description is now made on the write operation of the serial access memory.

For example, when the memory cell 10 in the n-th row in the (k+1)-th column is selected by the write row selecting ring pointer 62 and the write column selecting ring pointer 64 shown in FIG. 1A, a potential on the write word line $WWL_n$ rises to an "H" level and a write column selecting signal $WBS_{k+1}$ rises to the "H" level. Thus, an output of the write selecting gate 12 in the n-th row in the (k+1)-th column attains the "H" level, so that the transistor 1 is turned on. As a result, input data DI buffered by the write driver 11 is written to the storage capacitance 4 in the memory cell 10 through the write bit line $WB_{k+1}$.

At that time, since write column selecting signals WBS in columns other than the (k+1)-th column and potentials on write word lines WWL in rows other than the n-th row are at an "L" level, outputs of write selecting gates 12 other than the write selecting gate 12 in the n-th row in the (k+1)-th column are at the "L" level. Thus, all of transistors 1 in memory cells 10 in columns other than the (k+1)-th column and rows other than the n-th row are turned off, so that information stored in the memory cells 10 are not destroyed.

Description is now made on the read operation of the serial access memory.

For example, when the memory cell 10 in the n-th row in the (k+1)-th column is selected by the read row selecting ring pointer 63 and the read column selecting ring pointer 65, a potential on the read word line $RWL_n$ rises to the "H" level. At that time, all of information stored in memory cells 10 in the n-th row are read out to read bit lines $RB_1$ to $RB_m$. However, the information are outputted only from the read circuit 13 in the (k+1)-th column selected by the read column selecting signal $RBS_{k+1}$.

An FIFO (first in first out) memory which is one kind of serial access memory comprising three-transistor type memory cells is described in "Introduction to NMOS and CMOS VLSI System Design", pp. 268 to 273.

In the above described conventional semiconductor memory device comprising three-transistor type memory cells, since a gate circuit for selecting a memory cell to which information is to be written is required, the scale of a circuit becomes large by the gate circuit and the area to be occupied is increased. For example, if a single CMOS gate circuit is provided for every 8-bit memory cells (eight memory cells), the area occupied by the gate circuit becomes approximately 35% of the area of the entire memory cell array. In addition, if the gate circuit comprises a CMOS, a latch-up may be caused. The latch-up is a phenomenon that a circuit failure occurs by thermal radiation.

SUMMARY OF THE INVENTION

An object of the present invention is to provide a semiconductor memory device comprising three-transistor type memory cells in which normal write operation is performed without gate circuits.

Another object of the present invention is to provide a semiconductor memory device in which read operation and write operation can be performed independently each other with reduced area to be occupied. Still another object of the present invention is to provide a semiconductor memory device in which capacity can be increased comprising three-transistor type memory cells.

In order to attain the above described objects, a semiconductor memory device according to the present invention comprises a plurality of memory cells arranged in at least one column for storing information, at least one pair of write bit lines provided corresponding to each column of the plurality of memory cells for writing information to the plurality of memory cells, at least one read bit line provided corresponding to each column of the plurality of memory cells for reading out information stored in the plurality of memory cells, a plurality of first selecting lines provided corresponding to each of the memory cells in each column, a plurality of second selecting lines provided corresponding to each of the memory cells in each column, first selecting means for applying a first selecting signal to any of the plurality of first selecting lines, and second selecting means for applying a second selecting signal to any of the plurality of second selecting lines. Each of the memory cells comprises a first transistor for storing information, a second transistor connected between either one of the write bit line pair and the first transistor, and a third transistor connected between the read bit line and the first transistor. The second transistor is responsive to the first selecting signal applied to any of the first selecting lines for transferring to the first transistor information applied through one of the write bit line pair. The third transistor is responsive to the second selecting signal applied to any of the second selecting lines for transferring information stored in the first transistor to the read bit line.

In the semiconductor memory device according to the present invention, since the write bit lines have a folded bit line structure, write operation is correctly performed without using a gate circuit. Thus, the area to be occupied is decreased and capacity can be increased. In addition, since the semiconductor memory device comprises three-transistor type memory cells, write operation and read operation can be performed independently each other and high-speed operation can be performed.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1A is a schematic block diagram of a serial access memory;

DESCRIPTION OF THE PREFERRED EMBODIMENTS

Figure 1B:
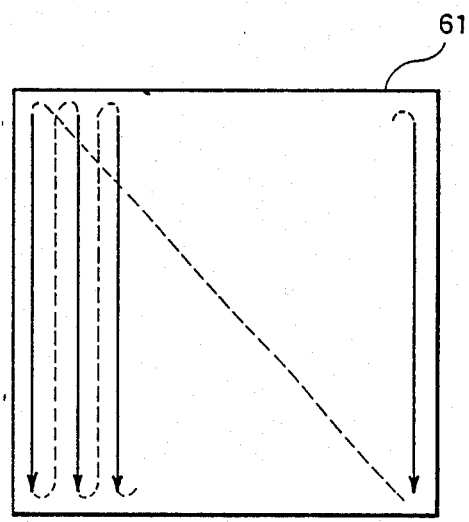
FIG. 1B is a diagram for explaining accessing in a serial access memory.

Referring to the drawings, embodiments of the present invention will be described.

Figure 3:
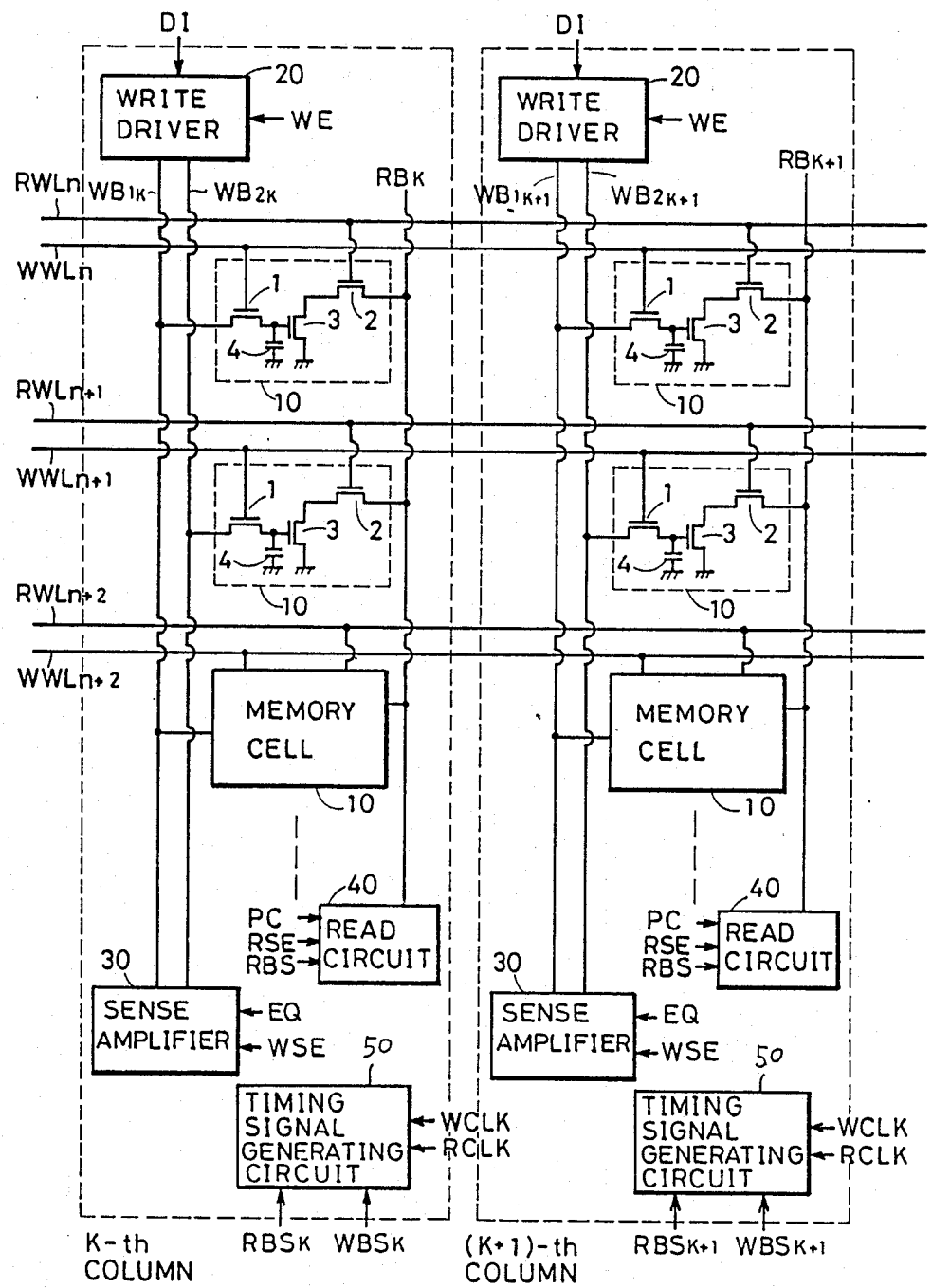
FIG. 3 is a circuit diagram showing structure of main portions of a serial access memory according to an embodiment of the present invention.

FIG. 3 is a circuit diagram showing structure of main portions of a serial access memory according to an embodiment of the present invention.

An entire structure of the serial access memory is the same as that of the serial access memory shown in FIG. 1. More specifically, the serial access memory comprises a memory cell array 61 having a plurality of memory cells arranged in l rows and m columns, a write row selecting ring pointer 62, a write column selecting ring pointer 64, a read row selecting ring pointer 63 and a read column selecting ring pointer 65.

Figure 2:
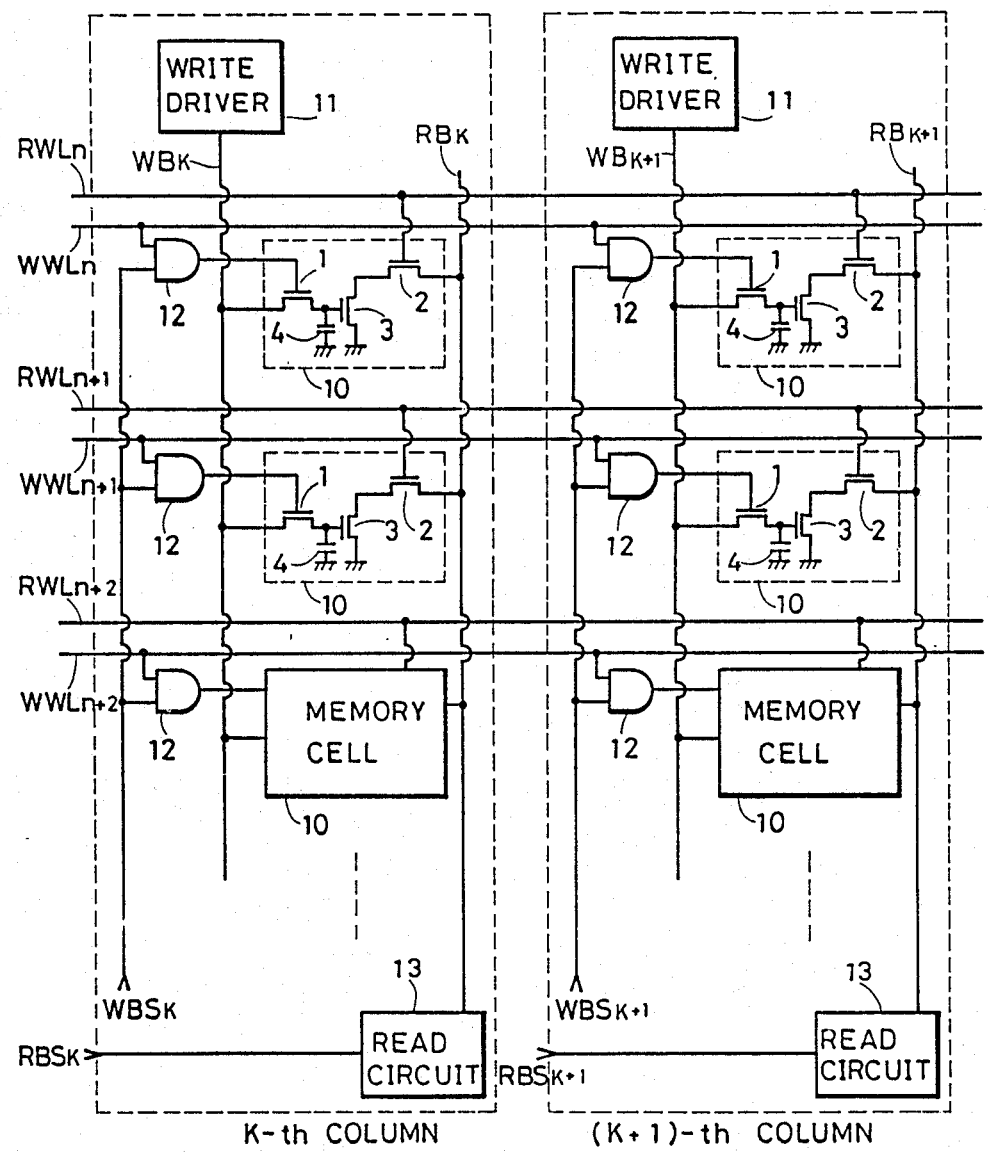
FIG. 2 is a diagram showing structure of main portions of a conventional serial access memory.

In FIG. 3, each of memory cells 10 comprises transistors 1, 2 and 3 and a storage capacitance 4 as in the conventional serial access memory shown in FIG. 2. A pair of write bit lines $WB1_k$ and $WB2_k$ and a read bit line $RB_k$ are provided corresponding to each column of the memory cell array, where k is any of integers from 1 through m. In addition, a write word line $WWL_n$ and a read word line $RWL_n$ are provided corresponding to each row of the memory cell array, where n is any of integers from 1 through l. Let's consider the memory cell 10 in the n-th row in the k-th column. The transistor 3 has its gate connected to the write bit line WB1$_k$ through the transistor 1, its drain connected to the read bit line RB$_k$ through the transistor 2 and its source connected to ground. The transistor 1 has its gate connected to the write word line WWL$_n$. The transistor 2 has its gate connected to the read word line RWL$_n$.

Structure of the memory cell 10 in the (n+1)-th row in the k-th column is the same as that in the memory cell 10 In the n-th row in the k-th column except that the transistor 3 has its gate connected to the write bit line WB2$_k$ through the transistor 1. More specifically, the memory cells 10 in odd rows in each column are connected to one of the write bit lines WB1$_k$ and WB2$_k$, and the memory cells 10 in even rows in each column are connected to the other of the write bit lines WB1$_k$ and WB2$_k$. Thus, it should be understood that the write bit lines WB1$_k$ and WB2$_k$ are adapted to be folded bit line structure.

A write driver 20 and a sense amplifier 30 are connected to the pair of write bit lines WB1$_k$ and WB2$_k$ in each column. The write driver 20 drives the pair of write bit lines WB1$_k$ and WB2$_k$ so that input data DI is provided to the bit lines WB1$_k$ and WB2$_k$. The sense amplifier 30 refreshes the memory cells 10 in each column. In addition, a read circuit 40 is connected to the read bit line RB$_k$ in each column. The read circuit 40 detects and amplifies information read out to the read bit line RB$_k$ and outputs the same to the exterior. The write driver 20, the sense amplifier 30 and the read circuit 40 are controlled by a timing signal generating circuit 50.

Figure 4:
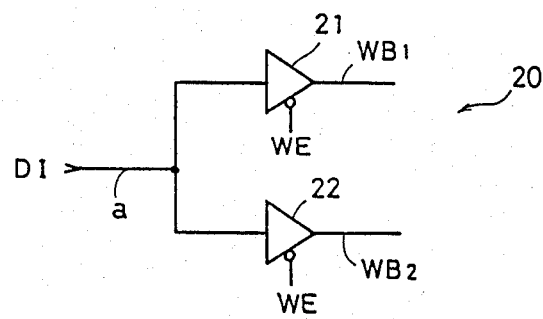
FIG. 4 is a circuit diagram of a write driver shown in FIG. 3.

FIG. 4 is a circuit diagram of the write driver 20 shown in FIG. 3.

In FIG. 4, a data input terminal a is connected to a write bit line WB1 through a first tri-state buffer 21 and connected to a write bit line WB2 through a second tri-state buffer 22. The first tri-state buffer 21 and the second tri-state buffer 22 are controlled by a write enable signal WE. When the write enable signal WE is at an "H" level, the first and second tri-state buffers 21 and 22 are rendered conductive, so that input data DI applied to the data input terminal a is inputted to the write bit line pair WB1 and WB2. When the write enable signal WE is at an "L" level, the first and second tri-state buffers 21 and 22 enter a high impedance state.

Figure 5:
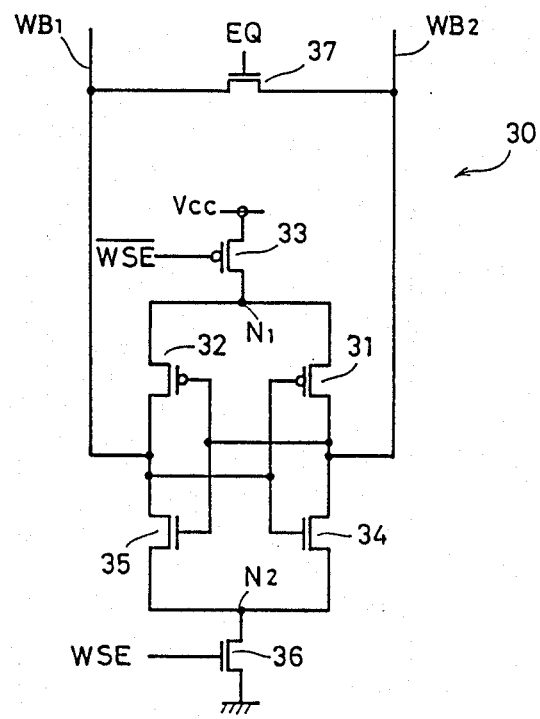
FIG. 5 is a circuit diagram of a sense amplifier shown in FIG. 3.

FIG. 5 is a circuit diagram of the sense amplifier 30 shown in FIG. 3.

The sense amplifier 30 comprises a latch circuit comprising P channel MOS transistors 31, 32 and 33 and N channel MOS transistors 34, 35 and 36 and an equalizing N channel MOS transistor 37. The transistor 31 is connected between a node N1 and a write bit line WB2, and the transistor 32 is connected between the node N1 and a write bit line WB1. The transistor 34 is connected between a node N2 and the write bit line WB2, and the transistor 35 is connected between the node N2 and the write bit line WB1. Each of the transistors 31 and 34 has a gate connected to the write bit line WB1. Each of the transistors 32 and 35 has a gate connected to the write bit line WB2. The node N1 is coupled to a power-supply potential V$_{CC}$ through the transistor 33, and the node N2 is connected to ground through the transistor 36. The transistor 36 has its gate receiving a sense enable signal WSE. The transistor 33 has its gate receiving an inverted signal $\overline{WSE}$ of the sense enable signal WSE. In addition the equalizing transistor 37 is connected between the write bit lines WB1 and WB2 and has its gate receiving an equalize signal EQ.

When the sense enable signal WSE attains the "H" level, the sense amplifier 30 amplifies the potential difference between the write bit lines WB1 and WB2 and latches the same. When the sense enable signal WSE attains the "L" level, the sense amplifier 30 enters a high impedance state. In addition, when the equalize signal EQ attains the "H" level, the transistor 37 is turned on, so that potentials on the write bit lines WB1 and WB2 are equalized to a V$_{CC}$/2 level.

Figure 6:
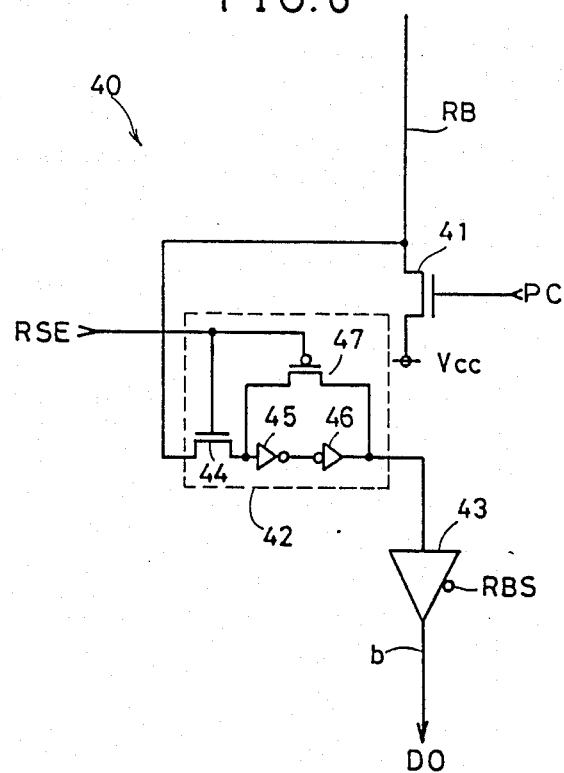
FIG. 6 is a circuit diagram of a read circuit shown in FIG. 3.

FIG. 6 is a circuit diagram of the read circuit 40 show in FIG. 3.

In FIG. 6, a read bit line RB is coupled to a power-supply potential V$_{CC}$ through a precharging N channel MOS transistor 41. The transistor 41 has its gate receiving a precharging signal PC. In addition, the read bit line RB is connected to a data output terminal b through a sense latch 42 and a tri-state buffer 43. The sense latch 42 comprises an N channel MOS transistor 44, two inverters 45 and 46 and a P channel MOS transistor 47. The inverters 45 and 46 are connected in series. The transistor 47 is connected between an input of the inverter 45 and an output of the inverter 46. The transistor 44 is connected between the input of the inverter 45 and the read bit line RB. The output of the inverter 46 is connected to an input of the tri-state buffer 43. Each of the transistors 44 and 47 has its gate receiving a sense enable signal RSE. Furthermore, the tri-state buffer 43 has a control terminal receiving a read column selecting signal RBS.

When the precharging signal PC attains the "H" level, the transistor 41 is turned on, so that the read bit line RB is precharged to a power-supply potential V$_{CC}$-V$_{TH}$, where V$_{TH}$ is a threshold voltage of the transistor 41. On the other hand, when the sense enable signal RSE rises to the "H" level, a potential on the read bit line RB is amplified by the sense latch 42. In addition, when the read column selecting signal RBS attains the "H" level, the tri-state buffer 43 is rendered conductive, so that an output of the sense latch 42 is derived from the tri-state buffer 43 to the data output terminal b. When the read column selecting signal RBS attains the "L" level, the tri-state buffer 43 enters a high impedance state.

Figure 7:
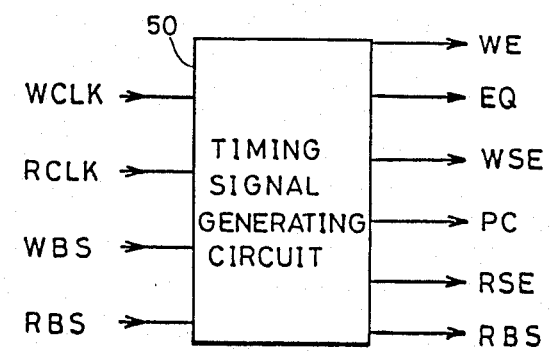
FIG. 7 is a diagram showing a timing signal generating circuit shown in FIG. 3.
Figure 8:
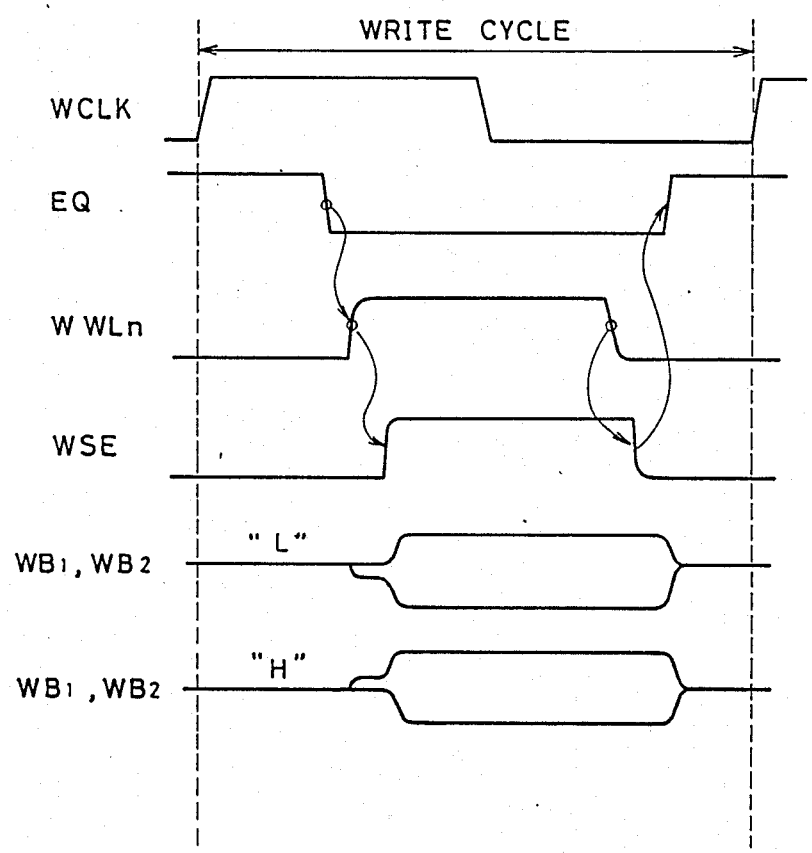
FIG. 8 is a timing chart for explaining refresh operation of the serial access memory shown in FIG. 3.

FIG. 7 is a circuit diagram showing the timing signal generating circuit 50. The timing signal generating circuit 50 is responsive to a write clock WCLK and a write column selecting signal WBS applied by the write column selecting ring pointer 64 for generating a write enable signal WE, an equalize signal EQ and a sense enable signal WSE at a predetermined timing. In addition, the timing signal generating circuit 50 is responsive to a read clock RCLK and a read column selecting signal RBS applied by the read column selecting ring pointer 65 for generating a precharging signal PC, a sense enable signal RSE and a read column selecting signal RBS at a predetermined timing.

Description will be made on write operation, refresh operation and read operation of the serial access memory.

Referring now to FIGS. 3 to 5, write operation is described. The write operation is performed in synchronization with the write clock WCLK. It is assumed that the pair of write bit lines WB1 and WB2 are equalized in response to the "H" level of the equalize signal EQ (in FIG. 5). For example, it is assumed that the n-th row in the (k+1)-th column of the memory cell array 61 is selected by the write row selecting ring pointer 62 and the write column selecting ring pointer 64 shown in FIG. 1. The write clock WCLK rises and then, the write enable signal WE rises to the "H" level, so that the input data DI is provided to the write bit lines $WB1_{k+1}$ and $WB2_{k+1}$ (in FIGS. 3 and 4). In addition, when a potential on the write word line $WWL_n$ rises to the "H" level, the transistor 1 in the memory cell 10 is turned on, so that information on the write bit line $WB1_{k+1}$ is written to the storage capacitance 4 in the memory cell 10. Refresh operation is performed with respect to memory cells 10 in the other columns connected to the write word line $WWL_n$.

Referring to FIGS. 3 to 5 and 8, refresh operation is described.

It is assumed that the write bit lines WB1 and WB2 are equalized to a $\frac{1}{2}$ $V_{CC}$ level in response to the "H" level of the equalize signal EQ. The write clock WCLK rises to the "H" level and then, the equalize signal EQ falls to the "L" level. Furthermore, a potential on the write word line $WWL_n$ rises to the "H" level (in FIGS. 3 and 8). Thus, information stored in each of memory cells 10 in the n-th row is read out to the write bit line WB1 in each column. If information of the "H" level has been stored in the memory cell 10, a storage node in the memory cell 10 has been charged up at a $V_{CC}$ level (=5V). Charge stored in the storage node moves on the write bit line WB1, so that a potential on the write bit line WB1 is slightly increased, as compared with the $\frac{1}{2}$ $V_{CC}$ level. On the other hand, when information of the "L" level is stored in the memory cell 10, charge on the write bit line WB1 moves to the storage node in the memory cell 10, so that a potential on the bit line WB1 is slightly decreased, as compared with the $\frac{1}{2}$ $V_{CC}$ level. At that time, a potential on the other write bit line WB2 remains at the $\frac{1}{2}$ $V_{CC}$ level When the sense enable signal WSE applied to the sense amplifier 30 rises to the "H" level, the transistors 33 and 36 in the sense amplifier 30 are turned on, so that the sense amplifier 30 is operated (in FIG. 5). If the potential on the write bit line WB1 is higher than the potential on the write bit line WB2, the potential on the write bit line WB1 rises to the $V_{CC}$ level and the potential on the write bit line WB2 falls to a ground level, so that the potentials are latched by inverter couples comprising the transistors 31, 32, 34 and 35. Therefore, the storage node in the memory cell 10 rises to the $V_{CC}$ level. In the above described manner, refresh operation is performed. At that time, since all of potentials on write word lines WWL in the other rows are at the "L" level, memory cells 10 in the other rows are not affected even if the potentials on the write bit lines WB1 and WB2 change.

Thereafter, if the potential on the write word line $WWL_n$ falls to the "L" level, data is held in the memory cell 10. The sense enable signal WSE falls and then, the equalize signal EQ rises to the "H" level, so that the write bit lines WB1 and WB2 are equalized.

Therefore, at the time of write operation, refresh operation is performed with respect to the other memory cells in the same row as that of the memory cell to be written.

Figure 9:
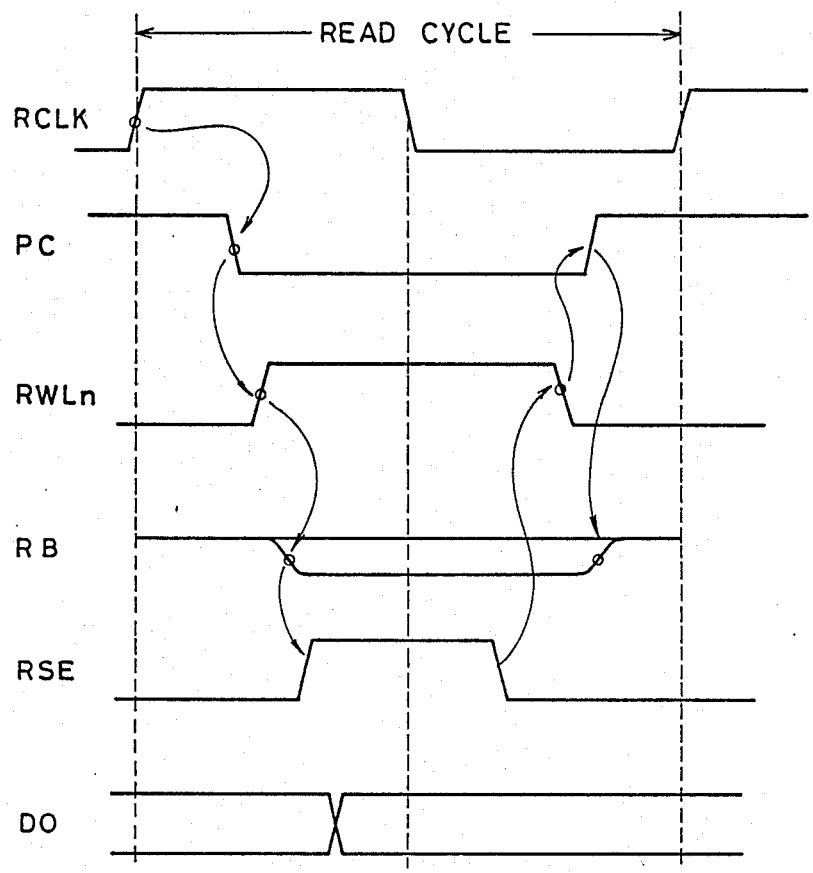
FIG. 9 is a timing chart for explaining read operation of the serial access memory shown in FIG. 3.

Referring now to FIGS. 3, 6 and 9, read operation is described.

Read operation is performed in synchronization with the read clock RCLK. It is assumed that the read bit line RB is precharged to a power-supply potential ($V_{CC}$-$V_{TH}$) in response to the "H" level of the precharging signal PC (in FIG. 6). For example, it is assumed that the n-th row in the (k+1)-th column of the memory cell array 61 is selected by the read row selecting ring pointer 63 and the read column selecting ring pointer 65 shown in FIG. 1. The read clock RCLK rises and then, the precharging signal PC falls to the "L" level. Furthermore, a potential on the read word line $RWL_n$ rises to the "H" level. Thus, information in all of the memory cells 10 in the n-th row are read out to read bit lines RB (in FIGS. 3 and 9). When information of the "H" level is stored in the memory cell 10 in the n-th row in the (k+1)-th column, the transistors 2 and 3 are rendered conductive, so that charge on the read bit line $RB_{k+1}$ is emitted. Therefore, the potential on the read bit line $RB_{k+1}$ falls to the "L" level. On the other hand, when information of the "L" level is stored in the memory cell 10, the transistor 3 is rendered non-conductive, so that charge on the read bit line $RB_{k+1}$ is not emitted. Thus, the potential on the read bit line $RB_{k+1}$ remains at the "H" level. More specifically, information which is complementary to information written to the memory cell 10 appears on the read bit line $RB_{k+1}$, which can be neglected if the information is inverted by an inverter or the like.

Then, if the sense enable signal RSE applied to the sense latch 42 rises to the "H" level, information on the read bit line $RB_{k+1}$ is amplified (in FIG. 6). At that time, since the read column selecting signal RBS in the (k +1)-th column has been at the "H" level, the tri-state buffer 43 has been rendered conductive. Thus, information on the read bit line $RB_{k+1}$ amplified by the sense latch 42 is provided to the data output terminal b as output data DO.

In the other columns, since the read column selecting signal RBS is at the "L" level, the tri-state buffer 43 is in a high impedance state. Thus, information on read bit lines RB in the other columns are not provided to data output terminals b.

Thereafter, the sense enable signal RSE falls to the "L" level. A potential on the read word line $WBL_n$ falls in response to the fall. If the precharging signal PC rises to the "H" level, read bit lines RB are precharged.

As described in the foregoing, in the serial access memory according to the present embodiment, normal write operation is performed without using a gate circuit. Thus, the area to be occupied is decreased and capacity is increased. The above described serial access memory is useful for a line memory required for video signal processing since read operation and write operation can be performed independently each other and at high speed.

Figure 10:
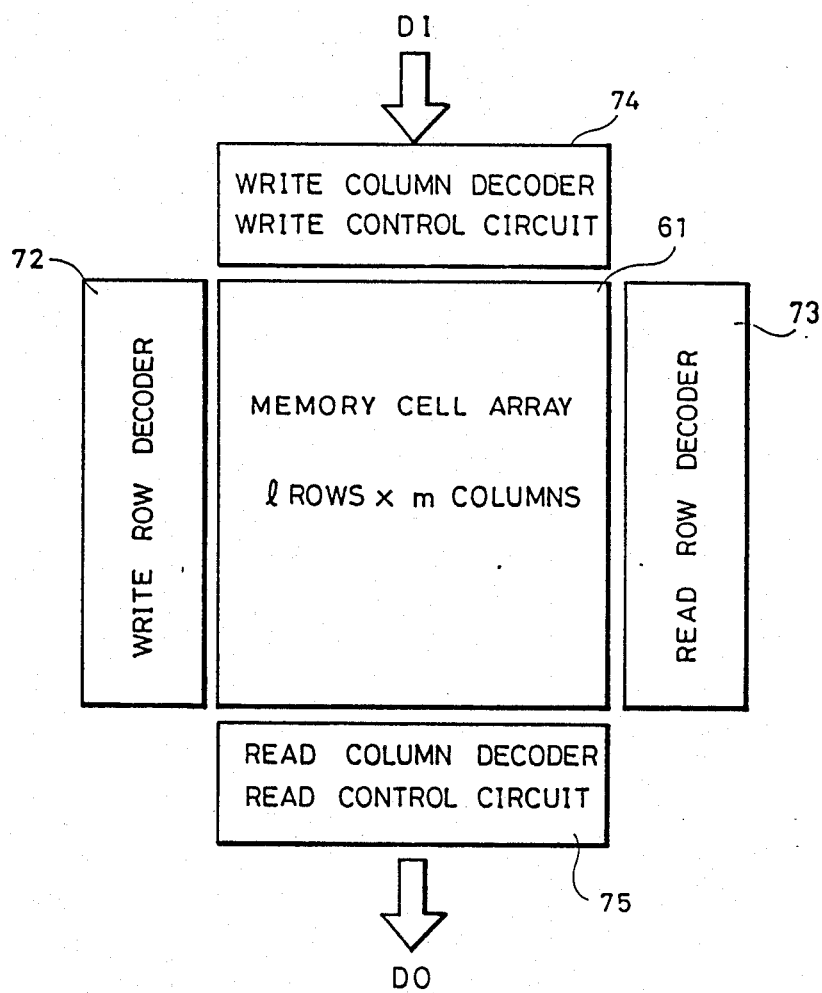
FIG. 10 is a block diagram showing structure of a random access type semiconductor memory device according to another embodiment of the present invention.

Although in the above described embodiment, a case was described in which the present invention is applied to the serial access memory, the write row selecting ring pointer 62, the read row selecting ring pointer 63, the write column selecting ring pointer 64 and the read column selecting ring pointer 65 shown in FIG. 1 may be replaced with a write row decoder 72, a read row decoder 73, a write column decoder 74 and a read column decoder 75 shown in FIG. 10, in which case a random access memory is achieved. Since the random access memory comprises three-transistor type memory cells, operation can be performed at higher speed, as compared with a random access memory comprising single transistor type memory cells.

Although in the above described embodiment, a general write driver, a sense amplifier and a read circuit are used, another circuit which performs the same operation may be used.

As described in the foregoing, according to the present invention, since write operation is correctly performed without using a gate circuit, a semiconductor memory device having large capacity is obtained in which the area to be occupied is small and it is hardly likely that latch-up occurs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells (10) arranged in at least one column for storing information,
   at least one pair of write bit lines, (WB1, WB2) provided corresponding to each of said at least one column of said plurality of memory cells (10) for writing information to said plurality of memory cells (10),
   at least one read bit line (RB) provided corresponding to each of said at least one column of said plurality of memory cells (10) for reading out information stored in said plurality of memory cells (10),
   a plurality of first selecting lines (WWL) provided corresponding to each of said memory cells (10) in each said column,
   a plurality of second selecting lines (RWL) provided corresponding to each of said memory cells (10) in each said column,
   first selecting means (62; 72) for applying a first selecting signal to any of said plurality of first selecting lines (WWL), and
   second selecting means (63; 73) for applying a second selecting signal to any of said plurality of second selecting lines (RWL),
   of each of said memory cells (10) comprising:
   first means (3) for storing an information signal;
   second means (1) responsive to said first selecting signal for transferring an information signal from either one of said pair of write bit lines (WB1, WB2) to said first means (3) to be stored therein; and
   third means (2) responsive to said second selecting signal for transferring said information signal stored in said first means (3) to said read bit line (RB).

2. A semiconductor memory device according to claim 1, wherein
   said first means comprises a first transistor (3) for storing information,
   said second means comprises a second transistor (1) connected between either one of said pair of write bit lines (WB1, WB2) and said first transistor (3) and responsive to said first selecting signal applied to said first selecting lines (WWL) for transferring to said first transistor (3) information applied through said one of said pair of write bit lines (WB1, WB2), and
   said third means comprises a third transistor (2) connected between said read bit line (RB) and said first transistor (3) and responsive to said second selecting signal applied to said second selecting line (RWL) for transferring information stored in said first transistor (3) to said read bit line (RB).

3. A semiconductor memory device according to claim 2, wherein
   said first transistor (3) comprises one conduction terminal coupled to a predetermined potential, another conduction terminal and a control terminal,
   said second transistor (1) comprises one conduction terminal connected either one of said pair of write bit lines (WB1, WB2), another conduction terminal connected to said control terminal in said first transistor (3) and a control terminal connected to said first selecting lines (WWL), and
   said third transistor (2) comprises one conduction terminal connected to said read bit line (RB), another conduction terminal connected to said other conduction terminal in said first transistor (3) and a control terminal connected to said second selecting lines (RWL).

4. A semiconductor memory device according to claim 3, wherein said first transistor (3), said second transistor (1) and said third transistor (2) comprise an MOS field effect transistor.

5. A semiconductor memory device according to claim 1, wherein said first selecting means comprises first sequentially selecting means (62) for applying sequentially said first selecting signal to said plurality of first selecting lines (WWL), and said second selecting means comprises second sequentially selecting means (63) for applying sequentially said second selecting signal to said plurality of second selecting lines (RWL).

6. A semiconductor memory device according to claim 5, wherein said first sequentially selecting means and said second sequentially selecting means comprise a ring pointer (62, 63).

7. A semiconductor memory device according to claim 6, which further comprises a refreshing sense amplifier (30) connected to each of said pairs of write bit lines (WB1, WB2) for amplifying information on the pair of write bit lines (WB1, WB2).

8. A semiconductor memory device according to claim 1, wherein memory cells in odd numbers of memory cells (10) in each said column are connected to one of said pair of write bit lines (WB1, WB2), and memory cells in even numbers of memory cells (10) in each said column are connected to the other of said pair of write bit lines (WB1, WB2).

9. A semiconductor memory device according to claim 1, which further comprises a write driver (20) connected to each of said pairs of write bit lines (WB1, WB2).

10. A semiconductor memory device according to claim 1, wherein said first selecting means comprises a first decoder (72) responsive to a first address signal externally applied for applying said first selecting signal to any of said first selecting lines (WWL), and said second selecting means comprises a second decoder (73) responsive to a second address signal externally applied for applying said second selecting signal to any of said second selecting lines (RWL).

11. A method of accessing according to claim 10, wherein said first selecting signal is applied sequentially to said plurality of first selecting lines (WWL), and said second selecting signal is applied sequentially to said plurality of second selecting lines (RWL).

12. A method of accessing according to claim 10, wherein said first selecting signal is applied to any of said first selecting liens (WWL) in response to said first address signal externally applied, and said second selecting signal is applied to any of said second selecting lines (RWL) in response to a second address signal externally applied.

13. A method of accessing a semiconductor memory, said device comprising:
   a plurality of memory cells (10) arranged in at least one column for storing information,
   at least one pair of write bit lines (WB1, WB2) provided corresponding to each column of said plurality of memory cells (10) for writing information to said plurality of memory cells (10),
   at least one read bit line (RB) provided corresponding to each column of said plurality of memory cells (10) for reading out information stored in said plurality of memory cells (10),
   a plurality of first selecting lines (WWL) provided corresponding to each of said memory cells (10) in each said column,
   a plurality of second selecting lines (RWL) provided corresponding to each of said memory cells (10) in each said column,
   first selecting means (62; 72) for generating a first selecting signal,
   second selecting means (63; 73) for generating a second selecting signal,
   each of said memory cells (10) comprising:
      a first transistor (3) for storing information,
      a second transistor (1) connected between either one of said pair of write bit lines (WB1, WB2) and said first transistor (3) and responsive to said first selecting signal applied to said first selecting lines (WWL) for transferring to said first transistor (3) information applied through said one of said pair of write bit lines (WB1, WB2), and
      a third transistor (2) connected between said read bit line (RB) and said first transistor (3) and responsive to said second selecting signal applied to said second selecting line (RWL) for transferring information stored in said first transistor (3) to said read bit line (RB),
   a method of accessing to said memory cell (10) comprising:
      applying a first selecting signal from said first selecting means (62; 72) to any of said plurality of first selecting lines (WWL), and
      applying a second selecting signal from said second selecting means (63; 73) to any of said plurality of second selecting lines (RWL).

* * * * *